United States Patent [19]

Reddy

[11] 4,238,697

[45] Dec. 9, 1980

[54] RPM INFORMATION SIGNAL GENERATING CIRCUITRY FOR ELECTRONIC FUEL CONTROL SYSTEM

[75] Inventor: Junuthula N. Reddy, Horseheads, N.Y.

[73] Assignee: The Bendix Corporation, Southfield, Mich.

[21] Appl. No.: 226,486

[22] Filed: Feb. 15, 1972

Related U.S. Application Data

[63] Continuation-in-part of Ser. No. 101,896, Dec. 28, 1970, Pat. No. 3,734,068.

[51] Int. Cl.³ .......................... H03K 5/04; H03K 5/08; H03K 5/153

[52] U.S. Cl. .................................... 307/268; 307/360; 307/265; 307/227; 307/228; 123/478;

[58] Field of Search ............... 307/234, 235, 227, 228, 307/265, 268; 328/133-135; 123/102, 118

[56] References Cited

U.S. PATENT DOCUMENTS

| | | | |
|---|---|---|---|
| 3,337,814 | 8/1967 | Brase | 328/134 |
| 3,386,037 | 5/1968 | Yamada | 328/134 |
| 3,391,344 | 7/1968 | Goldberg | 328/134 |
| 3,482,170 | 12/1969 | Ananiades | 307/235 |
| 3,521,174 | 7/1970 | Naubereit | 328/134 |
| 3,563,219 | 2/1971 | Mieras | 123/118 |
| 3,725,795 | 4/1973 | Mesenhimer | 328/135 |

*Primary Examiner*—John S. Heyman
*Attorney, Agent, or Firm*—Gerald K. Flagg; Russel C. Wells

[57] ABSTRACT

A circuit for generating an rpm responsive information signal for electronic fuel control systems designed to provide intermittent actuation of a fuel delivery system is illustrated herein. In an electronic fuel control system which relies upon excursions of a controlled voltage through a selected threshold level to generate the injection controlling signal, a circuit is provided to control the variation, as a function of engine rpm, of the initial value of the injection controlling voltage. Means are also illustrated for updating the engine rpm information at least once per engine triggering event to provide improved fuel delivery response to variations in engine rpm.

5 Claims, 5 Drawing Figures

RPM INFORMATION SIGNAL GENERATING CIRCUITRY FOR ELECTRONIC FUEL CONTROL SYSTEM

CROSS REFERENCE TO A RELATED APPLICATION

This application is a continuation-in-part of my co-pending patent application Ser. No. 101,896 "Fuel Injection Control System", filed Dec. 28, 1970 issued as U.S. Pat. No. 3,734,068 on May 22, 1973.

The present invention is related to my co-pending, commonly assigned patent application Ser. No. 226,498 entitled "Electronic Fuel Control System Including Electronic Means For Providing A Continuous Variable Correction Factor" filed Feb. 15, 1972.

BACKGROUND OF THE INVENTION

1. Field of the Invention

The present invention is related to the field of electronic fuel control systems for providing intermittent pulses of fuel to a power producing engine. More particularly, the present invention is related to that portion of the above noted field in which the injection pulses are generated in a time period during which a controlled voltage maintains a selected relationship with respect to a selected threshold value and in which the varying engine operating conditions are used to alter the state of the voltage being examined and/or the level of the selected threshold value. More particularly, the present invention is related to a system by which the value which the injection controlling examined portion of the controlled voltage may originate at is controllably varied as a function of substantially instantaneous engine rpm values.

2. Description of the Prior Art

It is well known in the prior art that the fuel requirement for an engine operating at constant load may vary as a function of the rpm value of the engine. In prior electronic fuel control systems, the rpm corrections have been generally provided by taking the average speed of the engine for a period of time preceding the instantaneous calculation in question and by altering the voltage used to excite one or more of the engine operating parameter sensors.

This approach has presented two difficulties. Firstly, by taking an average of the engine speed over a history of prior events, however brief, the response to changes in engine rpm is slow. Secondly, by applying a variation in the exciting voltage to one or more of the engine parameter sensors, an additional delay has been induced as a result of the inherent response delays in the sensor or sensors so excited. For instance, it has normally been the case to vary the excitation voltage for the intake manifold air pressure sensor. Such a sensor has an internal time delay due to the electrical and mechanical characteristics with which it is designed. Thusly, by the time the information of a change in engine speed is available to affect a change in the amount of fuel delivered to the engine, the engine may be operating under a speed condition which is inappropriate for the amount of fuel being provided by the fuel delivery system at that moment. It is thus an object of the present invention to provide a means for examining the engine rpm on a current, or substantially instantaneous, basis so as to provide the proper quantities of fuel to the engine for each cycle of its operation.

With the advent of fuel delivery computing techniques which rely principally on the excursion of a selected voltage through a selected threshold value it has been determined that an rpm correction may be provided by varying one of the two extreme values which the selected voltage may obtain. That is, for injection systems which provide fuel while a selected voltage is below a reference value, it is possible to vary the value at which that voltage may be initiated so as to controllably vary its total time below the threshold value. My co-pending commonly assigned patent application Ser. No. 219,275 filed January 20, 1972, hereby expressly incorporated herein by reference entitled "Circuit for Providing Electronic Full-Load Enrichment Fuel Compensation in an Electronic Fuel Control System" illustrates a system in which a controlled voltage waveshape is generated having a first shaped portion which generates a correction factor and a second shaped portion following immediately thereon to generate the fuel controlling pulse. The correction factor is provided by controllably varying the initial or starting value of the second shaped portion which in turn varies the time required for the second shaped portion to reach a threshold value. This correction factor is used to provide rpm correction. However, the circuitry of my prior case is capable of providing rpm correction factors on a basis of whether or not engine speed is above or below one selected rpm value. It is now known that rpm correction factors are required as a function of existing speed conditions and the determination of only one rpm value is insufficient. With the circuitry of my prior case, provision of greater detailed rpm information is difficult.

This difficulty arises from the inability of the computing techniques normally used in electronic fuel control systems to identify any particular engine rpm value by means other than integration techniques. Integration techniques provide at best an identification of an engine rpm one cycle after that rpm value is desired and at worst an averaging technique which is the average of rpm values over several past cycles of rpm. For the greatest accuracy of fuel delivery, it is necessary that the rpm information be as current as possible. It is therefore an object of the present invention to provide a means of generating rpm information and for updating this information each injection time period.

In order to match the manufacturing, cost, and accuracy benefits derived from a fuel control system as described in my above-noted co-pending application it is a further object of the present invention to provide circuitry capable of generating rpm information which is completely compatible with the electronics of my prior co-pending application.

In view of the fact that the speed of electronic devices and electronic computing techniques greatly exceeds the speed of operation of an internal combustion engine, it is well within the state-of-the-art to examine the time interval between successive triggering events and to compute therefrom the speed of the engine to generate rpm information which is sufficiently current to meet the general accuracy levels obtained by the present invention. However, by waiting until the occurrence of the next succeeding engine event to generate speed information would require a system of additional electronics to compute the rpm information and to apply that factor to the injection command signaling portion of the system for instance as illustrated and claimed in my above-mentioned co-pending application. It is therefore a still further object of the present invention to generate rpm information during the interval between successive triggering events which is available prior to the occurrence of the succeeding triggering event. As used herein "triggering event" is intended to mean the signal which is used to synchronize the fuel control system to selected angles of engine crank shaft rotation and also the condition of engine operation which gives rise to the signal.

I have determined that computation or generation of exact speed information per se is not necessary in order to achieve the objectives of the present invention and, in fact, the present invention provides suitable information in a form which is much more compatible with my aforementioned application and which is much less expensive to implement in circuit form than would be the electronics necessary to generate information of precise engine rpm. It is therefore an object of the present invention to provide circuitry for generating an rpm information signal which signal is being generated in the interval between successive triggering events without direct input of past triggering events and which does not rely upon the next succeeding triggering event for computation.

SUMMARY OF THE PRESENT INVENTION

The present invention provides electronic circuitry which is actuated by the occurrence of the triggering event and which thereafter generates an rpm signal as a function of the time elapsed from that triggering event. This signal may be used to control the variation in initial value of the computing waveshape. Due to the fact that the frequency of triggering events is proportional to the engine speed and therefore the duration of the interevent interval is inversely proportional to the engine speed, my invention continuously generates rpm information as a function of the time elapsed from the most recently to have occurred triggering event. Thus, information concerning the approximate engine speed will be present at the occurrence of the next succeeding triggering event but without the necessity of directly or indirectly computing the instantaneous engine speed. The present invention is characterized by providing a circuit means which responds to the occurrence of a triggering event and which provides as output as least one signal which occurs at a point in time after the triggering event and which time delay is predetermined to coincide with engine operation at or below a preselected rpm value. In a presently preferred embodiment of the present invention, a plurality of such signals are generated to indicate successively lower speeds of engine operation thereby defining regions of engine speed which may be adjusted to coincide with rpm values or points where the correction factor varies.

DETAILED DESCRIPTION OF THE DRAWING

Figure 1:
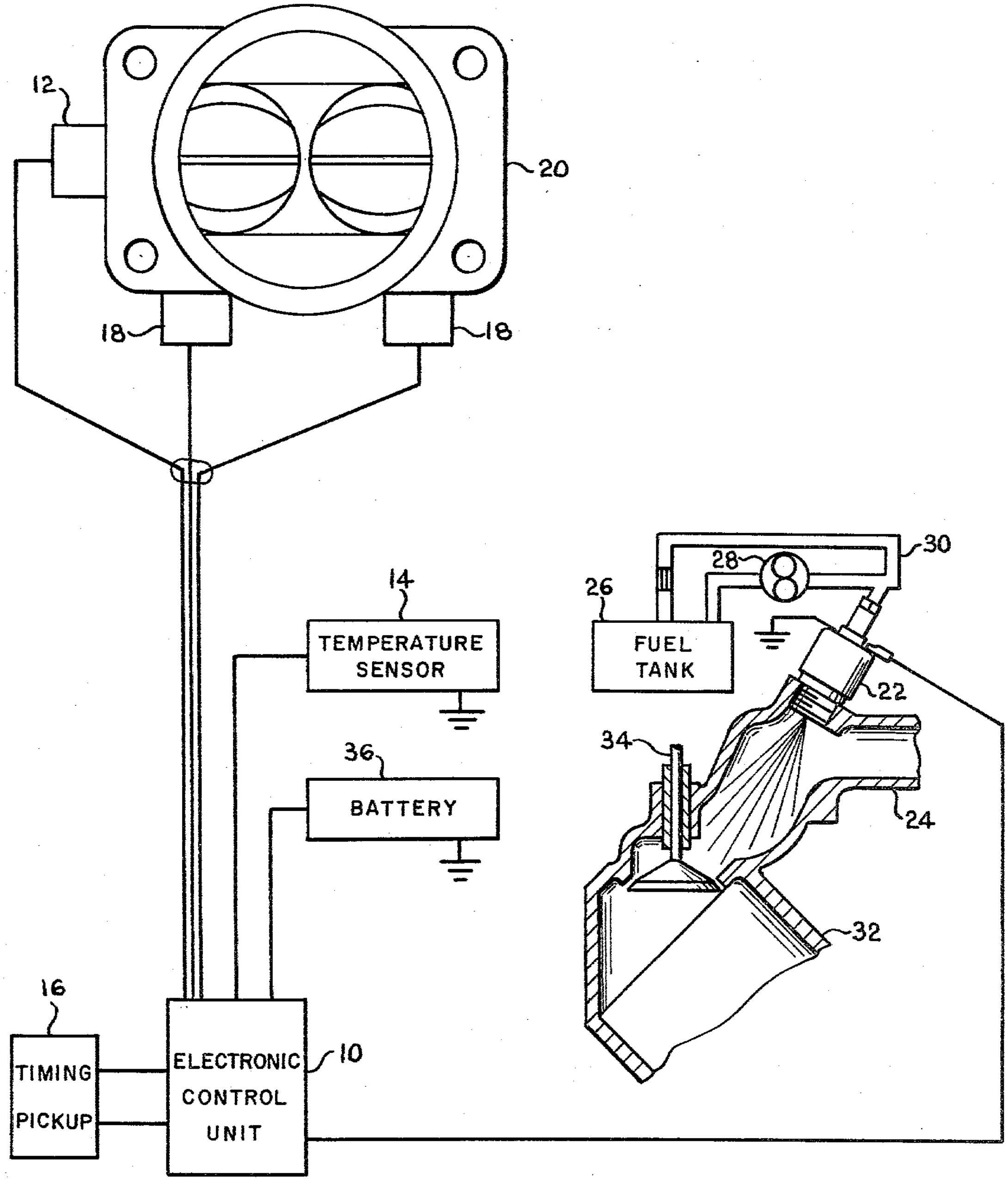
FIG. 1 shows, in diagramatic form, an electronic fuel control system for an internal combustion engine with which the present invention is of utility.

Referring now to FIG. 1, an electronic fuel control system is shown in diagramatic form. The system is comprised of a main computing means or electronic control unit 10, a manifold pressure sensor 12, a temperature sensor 14, an input timing means 16 and various other sensors denoted as 18. The manifold pressure sensor 12 and the associated other sensors 18 are illustrated mounted on throttle body 20 but it will be understood that other mounting locations are possible. The output of the computing means 10 is coupled to an electromagnetic injector valve member 22 mounted in intake manifold 24 and arranged to provide fuel from tank 26 via pumping means 28 and suitable fuel conduits 30 for delivery to a combustion chamber 32 of but one of several forms of an internal combustion engine, otherwise not shown. While the injector valve member 22 is illustrated as delivering a spray of fuel toward an open intake valve 34, it will be understood that this representation is merely illustrative and that other delivery arrangements are known and utilized. Furthermore, it is well known in the art of electronic fuel control systems that computing means 10 may control an injector valve means comprised of one or more injector valve members arranged to be actuated singly or in groups of varying numbers in a sequential fashion as well as simultaneously. The computing means is shown as energized by battery 36 which could be a vehicle battery and/or battery charging system as well as a separate battery.

Figure 2:
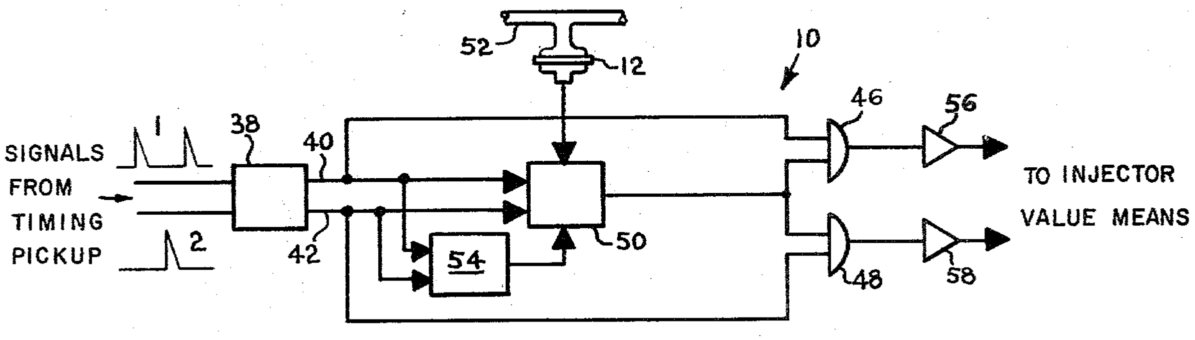
FIG. 2 shows a block diagram of one form of electronic control unit for use in the system of FIG. 1.

The block diagram shown in FIG. 2 illustrates the computing means 10 in a nonparticularized manner as applied to two-group injection. In FIG. 2, there is shown a switching device 38 capable of producing alternating output signals and receiving as input a signal or signals representative of engine crank angle as from sensor 16. Mechanically, sensor 16 could be a single-lobed cam, driven by the engine and alternately opening and closing a pair of contacts. Since this arrangement could generate spurious signals, as by contact bounce, the switching device 38 will be described and discussed as a flip-flop since the flip-flop is known to produce a substantially constant level of output at one output location and zero level at the other output location in response to a triggering signal which need only be a spike input as illustrated by traces 1 and 2 but may also be of longer duration and a flip-flop may be readily made insensitive to other types of signals. Signals received on the nontriggering input will, of course, have no effect on a flip-flop. Output conductors 40 and 42 are connected to the input of unit 50. Output conductors 40 and 42 are also connected to the inputs of a pair of AND gates with output conductor 40 being connected to one input of AND gate 46 and the output conductor 42 being connected to one input of AND gate 48. Unit 50 receives, as primary control input, signals from the pressure sensor 12 indicative of an engine operating condition and, therefore, of the engine fuel requirement. Sensor 12 is here shown coupled to a manifold lead or runner 52. The actual location of sensor 12 will depend upon the dynamic characteristics of the intake manifold and throttle body. Unit 50 also receives a signal from the rpm information signalling means 54 which is arranged to also receive the triggering signals from output conductors 40, 42. The output of the unit 50 is connected to a second input of each AND gate 46 and 48. The output of AND gate 46 is connected to amplifier 56 which, in turn, supplies controlling current to the first injector group. AND gate 48 is connected to amplifier 58 which supplies controlling current to the second injector group. For the sake of simplification, the additional control inputs have been omitted.

As will be readily apparent, the presence of an output signal from the flip-flop 38 will occur at one output location to the exclusion of the other. This signal will then appear at one input of only one AND gate of only one amplifier. This signal selectively designates an injector or injector group for imminent injection. For the sake of example, it may be assumed that the output signal of the flip-flop 38 is at output location 40 so that the signal also appears at one input of AND gate 46. The signal from the output 40 of the flip-flop 38 also appears at the unit 50 as well as the rpm information signalling means 54. Unit 50 is operative to produce an output during the passage of a predeterminable amount of time. This time is determined by the values of the sensory input applied to unit 50 as well as by the input provided by the rpm information signalling means 54. During this initial period of time the output of the unit 50 is providing a full-strength output signal. This signal is applied to one input of each of the AND gates 46 and 48. Because of the intrinsic nature of AND gates, an output signal is produced only while an input signal is being applied to each and every input. This then dictates that AND gate 46 will produce an output to be amplified by amplifier 56 to open the first injector group since it is receiving an injector selection command directly from the flip-flop 38 and an injector control command from the unit 50. At the end of the time delay period, unit 50 produces a zero level signal so that the injection control command output signal is removed from the input to the AND gate 46 and the output of the AND gate 46 goes to zero, thereby allowing the first injector group to close. During the period of time the first injector group is open, a metered amount of fuel under pressure is injected by the first injector group. Depending upon particular electronics selected, suitable amplifiers and/or inverters may be used to match obtainable signals with desired or necessary circuit responses.

Figure 3:
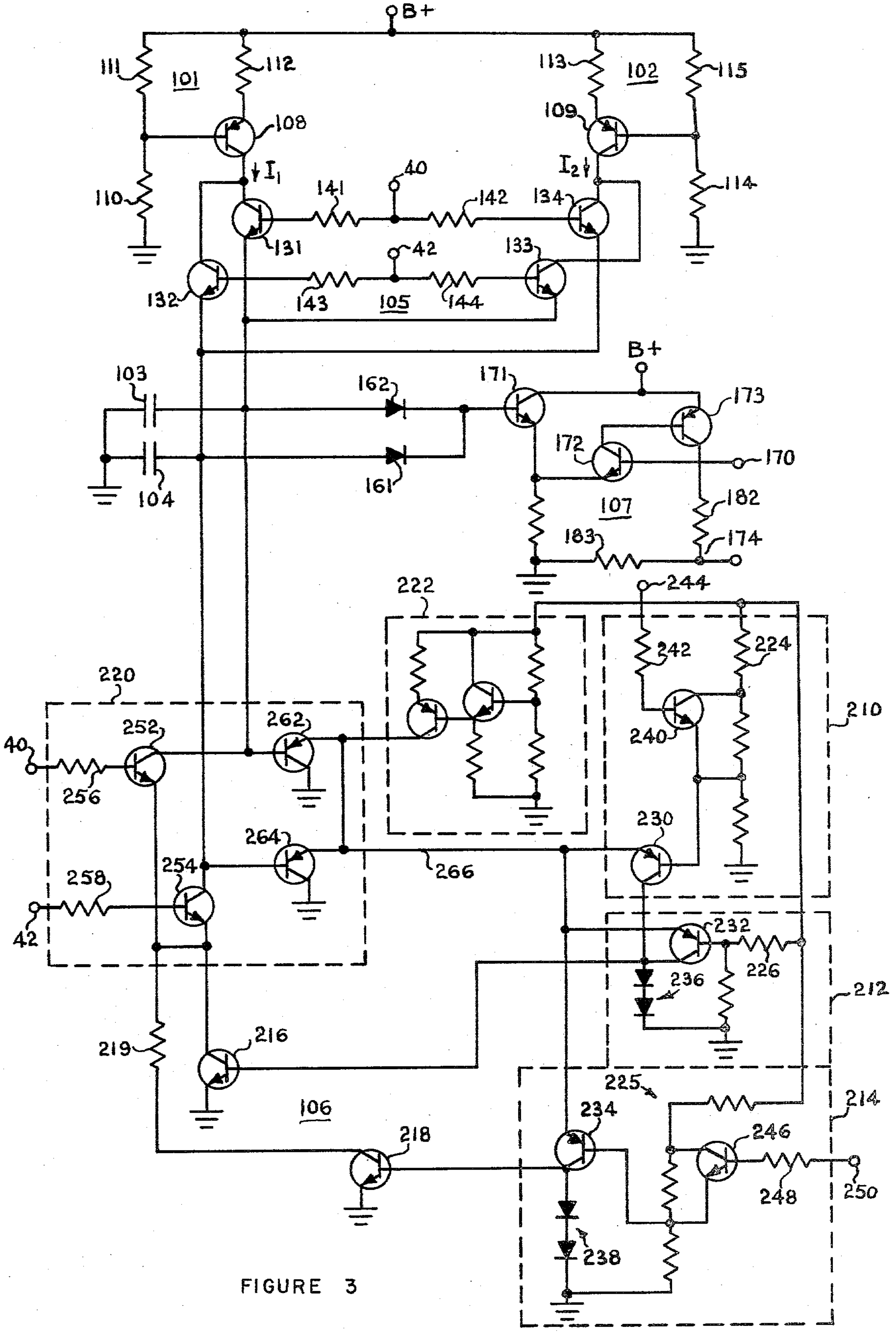
FIG. 3 shows an electronic circuit realization of a portion of the electronic control unit of FIG. 2.

Referring now to FIG. 3, an electronic circuit is illustrated to satisfy the functional requirements of block 50 in the block diagram of FIG. 2. The unit 50 is comprised of a pair of current sources 101, 102 which are alternately applied to a pair of timing capacitors 103, 104 by a switching network 105 receiving the triggering signals 40, 42. Also receiving triggering signals 40, 42, network 106 controls the level of the voltage on the selected capacitor 103, 104 prior to generation of the injection command signal. Threshold establishing circuit means 107 samples the highest voltage appearing across capacitors 103, 104 and compares this value with the level established by the signal received from pressure sensor means 12 at input port 170 to compute the fuel injection command signal.

The current source 101 is comprised of transistor 108 whose base is connected to the junction of a pair of voltage dividing resistors 110, 111 and whose emitter is connected to resistor 112. The resistors 111 and 112 are connected to a source of potential identified as B+ and resistor 110 goes to ground. Current source 102 is similarly comprised of a transistor 109 whose base is coupled to the junction of voltage divider resistors 114, 115 and whose emitter is connected to resistor 113 which is also connected to the B+ source. This arrangement is operative to establish a known level of current flow in the collectors of transistors 108, 109, respectively. The collector of transistor 108 is then connected in a parallel fashion to the collectors of a pair of transistors 131, 132. Similarly, the collector of transistor 109 is connected in parallel to the collectors of a pair of transistors 133, 134. The bases of transistors 131 and 134 are connected together through resistances 141, 142 while the bases of transistors 132, 133 are connected by way of resistances 143, 144. The junction of resistances 141, 142 is arranged to receive the trigger signals from output 40 while the junction of resistances 143, 144 is arranged to receive the trigger signals from output 42. The emitters of transistors 131 and 133 are connected to capacitor 103 while the emitters of transistors 132 and 134 are connected to capacitor 104. This circuit is then arranged to provide the current flow from current source 101 through transistor 131 to capacitor 103 and the current from source 102 through transistor 134 to capacitor 104 whenever a high voltage signal appears on output 40 and a low voltage signal appears on output 42. Whenever a low voltage signal is present on output 40 and a high voltage signal is present on output 42, the current from source 101 will flow through transistor 132 to capacitor 104, while the current from source 602 flows through transistor 133 to capacitor 103.

The threshold establishing circuit receives a signal indicative of the manifold pressure at 170 and this signal is applied to the base of transistor 172. The base of transistor 171 receives by way of diodes 161, 162 the signal from the one of capacitors 103, 104 whose accumulated charge, or voltage, is highest. As the emitters of transistors 171, 172 are coupled together, one of these transistors will be in conduction depending upon which has a base residing at a higher voltage value. When the value appearing on the base of transistor 171 exceeds the value appearing on circuit input 170, transistor 171 will go into conduction and transistor 172 will drop out of conduction. Termination of conduction of transistor 172 will consequently terminate conduction of transistor 173. While transistor 172 was conducting, transistor 173 was also conducting and a relatively high voltage signal was present at circuit location 174 due to the voltage divider action of resistors 182, 183. However, termination of conduction of transistor 173 will result in a substantially zero or ground level signal appearing at circuit location 174 due to the lack of current flow through the resistors 182, 183. This output signal may be applied to the AND gates 46, 48 in the FIG. 2 embodiment to constitute an injection command signal.

The timing capacitor discharging and initial charge controlling circuitry 106 is comprised of a plurality of reference level establishing means 210, 212, and 214, a pair of discharging means 216, 218, switching means 220 and a current source means 222. The reference level establishing means 210, 212, and 214 are connected to the source of energy indicated as B+ and are comprised of voltage divider means 224, 226, and 228, respectively, and voltage signal communicating transistor means 230, 232, and 234 respectively. The voltage communicating transistor means 230, 232, and 234 are arranged to have their bases communicated to a portion of the voltage divider means so that a known level of voltage may appear thereon and their emitters are connected to a common point. The collectors of the transistors 230 and 232 are coupled together and are communicated to ground through a diode means 236 while the collector of transistor 234 is communicated to ground through a separate diode means 238. The collector/diode junction of the transistors 230, 232 and diode means 236 is communicated to the discharging means 216 while the collector/diode junction of transistor 234 and diode means 238 is communicated to the discharging means 218.

Reference level establishing means 210 further includes a transistor 240 whose collector and emitter terminals are arranged to short circuit at least a portion of the voltage divider means 224 when the transistor is in conduction. The base of transistor 240 is coupled to resistance 242 which is in turn coupled to external terminal 244. Similarly, reference level establishing means 214 includes a transistor 246 arranged in short circuit relationship to at least a portion of the voltage divider means 228. Resistance 248 appears in the base circuit 246 and this is communicated to external terminal 250.

Energy dissipating means 216 and 218 are here illustrated as transistor elements having their emitter electrodes connected to ground and their base electrodes connected to the collectors, respectively, of transistor members 232 and 234. The collector of transistor 216 is coupled to switching means 220 while the collector of transistor 218 is coupled to resistance 219 which is in turn coupled to switching means 220.

The switching means 220 is comprised of a pair of transistors 252, 254 having resistors 256 and 258 in their base circuits. Resistor 256 is further connected to terminal 40 and resistor 258 is connected to terminal 42. The emitters of the transistors 252 and 254 are coupled together through circuit connection 260 and this common circuit connection is in turn connected to the energy dissipating means 216 and 218. In the illustrated embodiment this is accomplished by connecting the collector of transistor 216 to the common junction and the collector of transistor 218 through further resistor 219 which is then connected to the common junction 260. The collector of each of the switching transistors 252, 254 is coupled to the base of a regulating transistor 262, 264 respectively and each of these collector-base connections is connected to one of the two timing capacitors 103, 104 so that switching transistor 252 is coupled to regulating transistor 262 and also to timing capacitor 103 while switching transistor 254 is coupled to regulating transistor 264 and also to timing capacitor 104.

The regulating transistors 262, 264 and the controlled regulation transistors 230, 232 and 234 are intercoupled in a common-emitter configuration by common circuit location 266 coupled directly to each of the emitters of the five above enumerated transistors. Each of the five transistors is illustrated as being a pnp transistor with the regulating transistors 262, 264 having their collectors connected to ground and the controlled regulation transistors 230, 232 and 234 having their collectors connected to ground through a diode means which is here illustrated as the pairs of diodes identified as 236 and 238.

Current source means 222, which is herein illustrated as a conventional transistorized current source, is operative to provide a known level of current to the common circuit location 272. As is known in the art, the configuration comprising the transistors 230, 232, 234, 262, and 264 each having a voltage signal applied to the base thereof will have only those transistors in conduction which have the lowest identical base voltage. In the event that there is a single base residing at a lowest potential, that transistor and only that transistor will be in conduction and all others will be turned off due to the fact that the common emitters will be residing at a potential which is one pn junction above the value of the lowest base voltage and this value will be insufficient to forward bias any other emitter-base junctions.

The circuit as illustrated is arranged to provide the lowest voltage potential at the base of controlled regulation transistor 232 when signals are present on each of the input terminals 244, 250. In such a configuration, and assuming a varying voltage appearing across both the timing capacitors 103, 104, whenever the potential appearing across the appropriate one of the timing capacitors becomes identical with the voltage appearing on the base of the controlled regulation transistor 232, the regulating transistor which is coupled to the appropriate timing capacitor will begin to conduct so as to maintain that timing capacitor at the potential then appearing on the base of transistor 232. By suitably arranging the various resistive values within the voltage divider resistive networks 224, 226 and 228, it can be arranged that the base of the controlled regulation transistor 232 will be at a value lower than the base of either of controlled regulation transistors 230, 234 while the shorting transistors 240 and 246 are switched on and will be at a higher value than at least one of the bases of controlled regulation transistors 230, 234 while either of shorting transistors 240 and 246 is not conducting. Furthermore, it can be arranged that the lowest voltage appearing at any of the three bases 230, 232, 234 may be sequentially varied by controlling the conductive states of the shorting transistors through the signals applied to the external terminals 244, 250.

Figure 4:
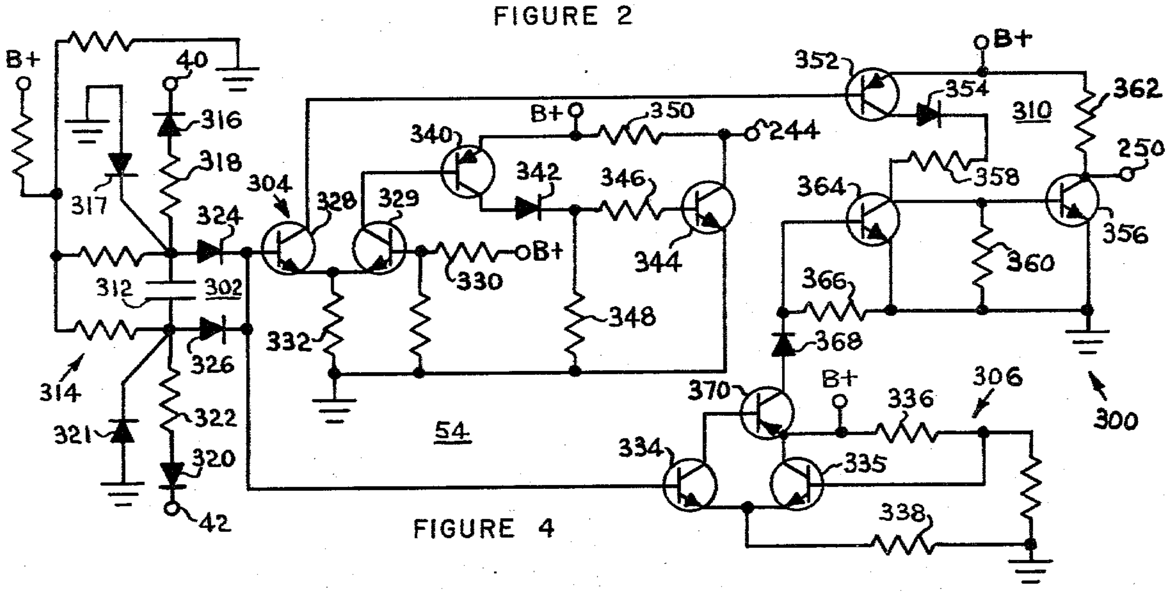
FIG. 4 shows an electronic circuit realization of the present invention according to FIG. 2 and for utilization with the circuit of FIG. 3.

Referring now to FIG. 4, a circuit according to the present invention is illustrated for generating rpm information in a presently preferred embodiment to selectively control the voltage appearing at the external terminals 244, 250 of the circuit 300 of FIG. 3. The circuit is comprised of a triggering section 302, a plurality of switching sections 304, 306 and a plurality of signal generating means 308, 310. The triggering section is centered about 312 and further comprises resistive means 314 providing a voltage divider between the source of energy B+ and the ground as indicated for each terminal of capacitor 312. Input signalling leads comprising a diode and resistor also intercommunicate each terminal of capacitor 312 with the triggering output conductors 40 and 42. For example, diode 316 and resistance 318 intercommunicate the output conductor 40 with one side of capacitor 312 while diode 320 and resistance 322 intercommunicate the other side of capacitor 312 with the output conductor 42. Each side of capacitor 312 is also communicated to the bases of two transistors in the switching sections 304, 306 by further diodes 324, 326.

The switching section 304 is comprised of an emitter coupled pair of transistors 328, 329, and a reference voltage divider means 330. The emitter coupled pair of transistors are comprised of a pair of npn transistors having their emitters coupled to a further resistance 332 going to ground and having the collector of transistor 329 coupled to signal generating means 308 and the collector of transistor 328 coupled to signal generating means 310. The switching section 306 is similarly comprised of an emitter coupled pair of transistors 334, 335 and a reference voltage divider means 336. The emitter coupled pair of transistors have their emitters coupled to a further resistance 338 going to ground while the collector of transistors 335 is coupled to the B+ source of energy and the collector of the transistor 334 is coupled to the signal generating means 310.

Signal generating means 308 is comprised of transistor 340 whose base is coupled to the collector of transistor 329 and whose emitter is connected to the B+ source of energy. The collector of transistor 340 is coupled to anode of diode 342 whose cathode communicates with the base of transistor 344 through resistance 346. The cathode of diode 342 is also coupled to ground through resistance 348. The collector of transistor 344 is connected to the source of B+ supply through resistance 350 and the junction formed by resistance 350 and the collector of transistor 344 is then communicated to terminal 244 so that, in the presence of a current flow through transistor 344 the signal present on terminal 244 will be substantially the ground or low level signal and in the absence of current flow through transistor 344 the terminal 244 will be at a relatively high voltage value near the B+ supply.

Similarly, signal generating means 310 is comprised of an input transistor 352 whose emitter is connected to the B+ source of supply and whose base is communicated to the collector of transistor 328. The collector of transistor 352 is connected to the anode of diode 354 while the cathode of diode 354 is coupled to the base of output transistor 356 through resistance 358. The cathode of the diode 354 is also coupled to ground through resistance 360. The collector of transistor 356 is coupled to the B+ source of supply through resistance 362 and the junction formed between the collector of transistor 356 and the resistance 362 is communicated to the terminal 250. Signal generating means 310 also includes a further transistor 364 which is arranged to short circuit the resistance 360. The base of transistor 364 is coupled to resistance 366 and the cathode of diode 368 while the emitter of transistor 364 is connected to ground as is the other side of resistance 366. The anode of diode 368 is connected to the collector of transistor 370 whose base is coupled to the collector of transistor 334 within the switching section 306 and whose emitter is connected to the B+ source of supply.

Figure 5:
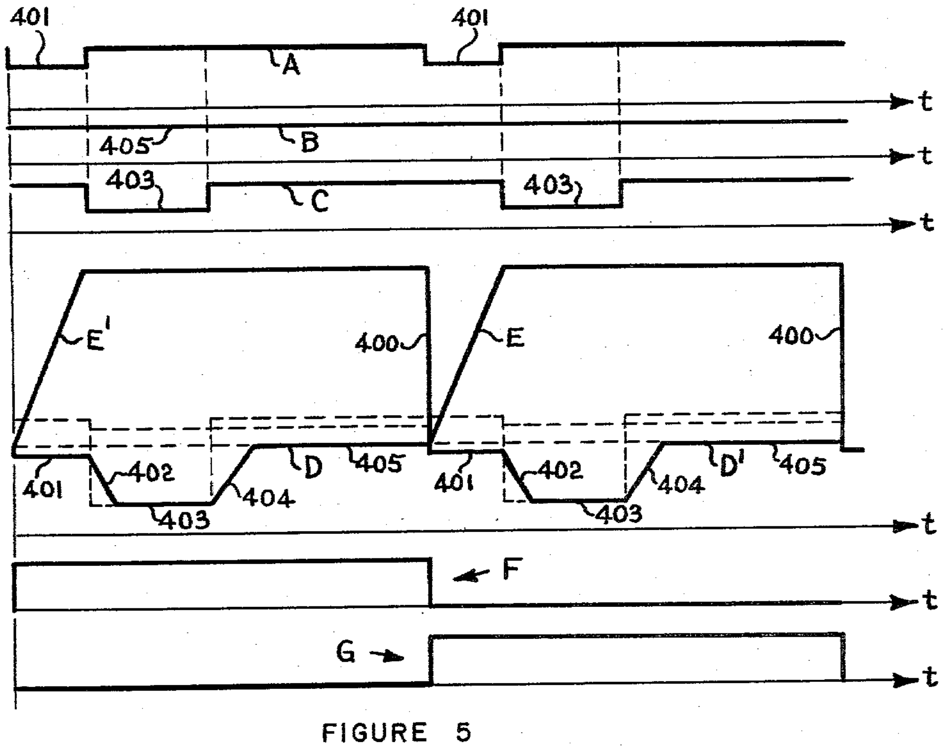
FIG. 5 illustrates a series of voltage wave forms which illustrate the operation of the FIGS. 3 and 4 circuit diagrams.

Referring now to FIGS. 3, 4 and 5 the operation of the present invention will be illustrated. Receipt of a triggering signal on the appropriate input lead will result in the signals on output conductors 40 and 42 to be substantially as illustrated in FIG. 5. That is to say a relatively high signal will appear on conductor 40 and a ground or zero level signal will appear on conductor 42. The zero level signal received on lead 42, when applied to the appropriate terminals of the circuit of FIG. 3, will be operative to turn off the various transistors which are in communication through their control electrode with the conductor 42 (for example transistors 132, 133, and 254). The presence of the high voltage signal on lead 40 will be operative to turn on those transistors whose control electrodes are in communication with the lead 40 (for example transistors 131, 134 and 252). Thusly, the current identified as $I_1$ will be applied to the timing capacitor 103 while the current identified as $I_2$ will be communicated to the timing capacitor 104. Also, the timing capacitor 103 will be communicated by way of transistor 252 to the common circuit connection 260. The preceding cycle of operation of this system will have provided the timing capacitor 103 with a relatively high voltage at the instant of switching. This voltage is communicated to the base of transistor 262 while the voltage then appearing on timing capacitor 104 which is some lower value is communicated to the base of transistor 264. Immediately following a triggering event, a current will be flowing through the diode means 236 from the reference level establishing means 210 as described hereinbelow. The presence of this current flow will be operative to turn energy dissipating transistor 216 on. This transistor, being turned on and communicated to the common circuit point 260, will be operative to dump the voltage then appearing on timing capacitor 103 and the voltage on the base of transistor 262 will drop. As this voltage approaches the voltage appearing on the base of the one transistor of the pair of transistors 230 which is providing the current flow through the diode means 236, this transistor will begin to turn off and the transistor 262 will begin to turn on due to their common emitter configuration. This switching off of the transistor 230 will result in the switching off of the transistor 216 and the voltage appearing on the timing capacitor 103 will then be regulated to the lowest voltage then appearing on the bases of transistors 230, 232, and 234. Since this initial phase of regulation will occur within the nominal switching time of electronic devices (which is known to be quite short) the voltage on the capacitor 103 will be regulated to the value of the portion 401 of the curve D of FIG. 5. Continued current flow of $I_1$ in the direction of timing capacitor 103 will flow to ground through the transistors 252 and 216.

The presence of a high voltage signal on lead 40 will have no effect upon the circuit of FIG. 4 since it will be blocked from transmittal to capacitor 312 by the diode member 316. However, the presence of a low voltage signal on input lead 42 will have the effect of drawing the side of capacitor 312 which is coupled to lead 42 to a very low near ground potential. The other side of capacitor 312 which was near ground during the preceding phase of operation will be held near ground by diode 317. The transistors 329 and 335 will go into conduction due to the presence of the relatively high voltage signals appearing on their bases. The conduction of transistor 329 will be operative to cause transistor 340 to conduct providing a base current flow to transistor 344 through diode 342 to resistance 346 causing transistor 344 to go into conduction. This will generate a relatively low, near ground, level signal on terminal 244 causing transistor 240 (FIG. 3) in the reference level establishing means 210 to be nonconductive. This will cause the voltage divider means 224 to establish a low level voltage signal on the base of transistor 230 which, by suitable arrangement of the resistive elements within the voltage divider networks 224, 226, 228 can be arranged to cause the base of transistor 230 to be at a potential lower than that of the bases of transistors 232 and 234.

While transistors 328 and 334 (FIG. 4) are nonconductive, the transistors whose bases are coupled to the collectors of the nonconductive transistors 328 and 334 (transistors 352 and 370) will also be nonconductive. This will cause transistor 356 to be nonconductive and the voltage appearing on terminal 250 will be a relatively high voltage. This relatively high voltage applied through resistance 248 (FIG. 3) to the base of transistor 246 will be operative to cause transistor 246 to be conductive thereby shortcircuiting a portion of the voltage divider means 228 and applying a relatively high level of voltage signal to the base of transistor 234.

As the charge appearing across capacitor 312 (FIG. 4) begins to increase, the voltage applied to the bases of the nonconductive transistors 328, 334 will begin in increase. When this voltage reaches the switching levels established by the voltage divider means 330 and 336, the conductive state of the transistors within the two emitter coupled pairs will reverse. By suitably arranging the voltage dividers 330 and 336, the emitter coupled pair of transistors comprised of transistors 328 and 329 can be arranged to switch its conductive state earlier in time than the emitter coupled pair of transistors comprised of transistors 334 and 335. This can be accomplished by making the base voltage on transistor 329 lower than the base voltage on transistor 335 so that the charge across capacitor 312 as it increases will reach the value on the base of transistor 329 prior to the point in time when it reaches the value on the base of transistor 335. Upon switching of the current flow from transistor 329 to transistor 328, the transistor 340 will drop out of conduction while the transistor 352 begins to conduct. This will have the effect of turning off transistor 344 and turning on transistor 356. This will cause the voltage appearing on terminal 244 to increase and the voltage appearing on terminal 250 to decrease. This will establish the fact that engine rpm is less than the rpm associated with the time period required for capacitor 312 to charge to the value represented by the voltage divider 330. The effect of this upon the reference level establishing means 210 and 214 (FIG. 3) will be to switch on the transistor 240 and to switch off the transistor 246 so that the voltage appearing at the base of transistor 234 will decrease. Again by suitable arrangement of the various resistive values the voltage at the base of transistors 234 can be arranged to be lower than the voltage at the base of either of transistors 230, 232.

Assuming that the actual engine rpm value is relatively low so that the period of time between successive triggering events is relatively long, the charge across capacitor 312 (FIG. 4) will continue to increase until such time as it reaches a value established by the voltage divider 336 indicative of engine rpm lower than a second predetermined value. The current flow will then switch from transistor 335 to transistor 334 and transistor 370 will be switched on. This will provide a current flow through diode 368 to the transistor 364 within the signal generating means 310 providing a shortcircuit for current flow from transistor 352. The effect of this shortcircuit will be to prevent base current from entering the base of transistor 356 thereby turning that transistor off and causing the voltage signal appearing at terminal 250 to increase from the low or near ground level signal to a relatively high signal thereby establishing the second rpm breakpoint. This increase of voltage at the terminal 250 of the reference level establishing means 214 (FIG. 3) will be operative to trigger transistor 246 back into conduction thereby raising the voltage applied to the base of transistor 234. This increase in voltage at the base of transistor 234 coupled with the previous increase in voltage applied to the base of transistor 230 can readily be arranged through suitable selection of the resistive values in the voltage divider network 226 to render the base of transistor 232 lowest among the three so that the voltage appearing across the appropriate timing capacitor will be regulated to that value.

With specific reference now to FIG. 5, the curve identified as A represents the voltage applied to the base of transistor 230 as a function of time while the curve B represents the voltage applied to the base of transistor 232 as a function of time and the curve C represents the voltage applied to the base of transistor 234 as a function of time. The effect of the curves A, B, and C may be combined through the above described regulating action to produce the rpm correction waveform as shown in the graph representing the voltage applied to the timing capacitors. This voltage waveform is identified as D and represents the voltage applied to the timing capacitor 103 to provide desired rpm correction while the portion of the curve identified as E represents the voltage applied to the timing capacitor 103 (by current $I_2$) to generate the injection pulse. Waveforms D' and E' are also illustrated and represent the voltages appearing on the timing capacitor 104 during the same time period. The voltage waveforms F and G represent the triggering signals appearing on triggering conductors 40 and 42 respectively. It will be observed that the waveform D does not exactly coincide with the waveforms A, B, and C as waveform D contains ramp portions which occur at points in time coincident with the step functions.

The waveforms D and D' are comprised of level portions identified as 401, 403, 405 and two sloped portions 402, 404. In addition, the transition from waveform E' to successive waveform D' is indicated by portion 400. The portion of the curve D identified as 401 is a voltage level corresponding to the lowest portion of the waveform A also identified as 401, the portion identified as 403 corresponds to the lowest portion of the waveform identified as C, also identified as 403, while the portion identified as 405 corresponds to the curve B. The sloped portion 402 represents the rate of decay of the accumulated charge on the timing capacitor through resistance 219 and transistor 218 and the slope of this portion is controlled by the value of resistance 219. The sloped portion 404 is controlled by the rate of charging of the appropriate timing capacitor provided by the current $I_1$. The near vertical portion identified as 400 represents the drop in the voltage across the appropriate timing capacitor as the value decreases from that represented by the curve E through that represented by the initial portion of the curve D as the accumulated charge is "dumped" through transistor 216. The curve E is generated by the current flow $I_2$ being applied through the appropriate switching transistors to the appropriate timing capacitor and is additive to the value of voltage across the appropriate timing capacitor at the point in time of switching.

I claim:

1. A circuit for providing a speed indicative signal to indicate the speed of operation of an associated device wherein the device includes means for generating a pulse train of triggering even pulses, each said pulse indicative of the occurrence of a periodically occurring event and comprising a pulse starting portion and a pulse ending portion defining therebetween a pulse duration varying only with the speed of said associated device, said circuit comprising in combination:

event responsive means responsive to one of said triggering event pulses operative to produce an event signal characteristic having a magnitude which starts at predetermined starting level in response to said pulse starting portion, varies from said predetermined starting level at a predetermined rate for a time varying only with the time elapsed from said pulse starting portion, and is reset to said starting level on the occurrence of a said pulse ending portion, said event responsive means comprising first and second sources of constant potential, timing capacitor means comprising first and second terminals, first and second unidirectional current conducting devices each having first and second electrodes, said first electrodes being connected respectively to said first and second terminals, and circuit means operative in response to said first and second pulse portions to permit said first and second constant potential sources to alternately charge and discharge said capacitor respectively at said first and second terminals whereby said event signal characteristics are alternately provided and removed thereat;

reference establishing means operative to generate first and second signals representative of respective first and second of elapsed time from the occurrence of said pulse starting portion;

comparison means connected to said reference establishing means and commonly connected to said second electrodes of said unidirectional current conducting devices operative to generate first and second output signals each switchable from a first to a second value when said event signal characteristic exceeds said first and second representative signals respectively; and utilization means connected to said comparison means operative during a said duration to generate a waveform having levels determined in accordance with said first and second values.

2. A circuit responsive to the variable duration defined between successive first and second pulse portions of a pulse train pulse and varying only with the speed of an associated device, said circuit providing at least two multi-level output signals and changing the level of one signal at a time when the other is not changed comprising:

first and second output signals providing means for respectively providing first and second output signals;

first switching means responsive to a control signal for controlling said first signal providing means and for changing the level of said first output signal when said control signal reaches a first predetermined value;

second switching means responsive to said control signal for controlling said second signal providing means and for changing the level of said second output signal when said control signal reaches a second predetermined value different from said first predetermined control signal value;

control signal providing and resetting means for providing said control signal having a value that varies at a predetermined rate from a predetermined starting level in response to the occurrence of a said first pulse portion and for resetting said control signal to said predetermined starting level in response to the occurrence of a said second pulse portion, said control signal providing means comprise means for responding to complementary first and second input signals, each having alternate high level and low level states defined by said first and second pulse portions, said control signal providing means including:

a capacitor;

first signal transmitting means for transmitting a first input signal to one side of said capacitor, the application of a low level signal to said first transmitting means discharging said one side of said capacitor, and the application of a high level to said first transmitting means permitting a charged build on one side of said capacitor;

second signal transmitting means for transmitting a second input signal to the other side of said capacitor, the application of a low level signal to said second signal transmitting means discharging said other side of said capacitor, and the application of a high level signal to said second signal transmitting means permitting the charging of said other side of said capacitor;

third signal transmitting means for transmitting voltage to both sides of said capacitor at a predetermined rate, the voltage on said capacitor comprising said control signal having a value that increases at a predetermined rate;

unidirectional current conducting means connecting each side of said capacitor with said first and second switching means to provide said conrol signal increasing at said predetermined rate to both said first and second switching means in response to a signal increase on either side of said capacitor; and means connecting said first switching means with said second signal providing means for also changing the level of said second output signal when said control signal reaches said first predetermined value, the circuit thereby providing at least three output signal level changes in response to a variation of said control signal through said first and second predetermined values.

3. The signal providing circuit of claim 2 in which:

said first output signal providing means comprise means responsive to said first switching means for increasing the level of said output signal when said control signal reaches said first predetermined value; and said second output signal providing means comprise means responsive to said first switching means for decreasing the value of said second output signal when said control signal reaches said first predetermined value, and means responsive to said second switching means for increasing the level of said second output signal when said control signal reaches said second predetermined value.

4. The signal providing circuit of claim 3 in which:

said second predetermined control signal value is greater than said first predetermined control signal value; and said control signal providing means comprise:

means for providing a control signal having a value that increases at a predetermined rate; and means for reducing the level of said control signals at regular intervals to thereby form a cyclic control signal having a frequency determining the level changes provided to said first and second output signals.

5. A circuit for generating and utilizing a variable number of predetermined elapsed time signals between successive pulses of a pulse train, said pulses comprising successive first and second pulse portions defining therebetween a duration varying only with the speed of an associated device, said circuit comprising:

(a) pulse train generating means responsively connected to said device for generating a pulse train comprising said pulses;

(b) control signal initiating-varying-and-resetting means for initiating a single control signal at a predetermined starting level in response to said first pulse portion, varying said control signal at a predetermined rate between said predetermined starting level and a first predetermined elapsed time level when said duration is less than a first predetermined duration, between said first predetermined elapsed time level and a second predetermined elapsed time level when said duration is less than a second duration greater than said first duration, and above said second predetermined elapsed time level when said duration exceeds said second duration, and resetting said control signal to said starting level in response to said second pulse portion, said control signal initiating-varying-and resetting means comprising first and second sources of constant potential, timing capacitor means comprising first and second terminals, first and second unidirectional current conducting devices each having first and second electrodes, said first electrodes being connected respectively to said first and second terminals, and circuit means operative in response to said first and second pulse portions to permit said first and second constant potential sources to alternately charge and discharge said capacitor respectively at said first and second terminals whereby said control signals are alternately provided and removed thereat;

(c) reference level generating means for generating first and second predetermined reference levels indicative of said duration respectively at said first and second predetermined elapsed time levels;

(d) comparator and elapsed-time signal generating means connected to said second electrodes of said control signal generating means unidirectional current conducting devices and said reference level generating means for comparing said control signal and said first and second predetermined reference levels and generating a first of said variable number predetermined elapsed time signals only when said duration exceeds said first duration and a second of said variable number predetermined elapsed time signals only when said duration exceeds said second duration; and (e) utilization means connected to said comparator means for generating a waveform during a said duration, said waveform having a first breakpoint determined in response to said first variable number predetermined elapsed time signal and a second breakpoint determined in response to said second variable number predetermined elapsed time signal.

* * * * *